United States Patent [19]

Yamada et al.

[11] 4,180,777
[45] Dec. 25, 1979

[54] TUNING METER FOR USE WITH A PULSE COUNT FM DEMODULATION CIRCUIT

[75] Inventors: Tsuneo Yamada; Yukihiko Miyamoto, both of Tokyo, Japan

[73] Assignee: Trio Kabushiki Kaisha, Tokyo, Japan

[21] Appl. No.: 859,538

[22] Filed: Dec. 12, 1977

[30] Foreign Application Priority Data

Dec. 28, 1976 [JP] Japan .............................. 51-159460

[51] Int. Cl.² .......................................... H04B 1/16
[52] U.S. Cl. .................................. 325/363; 325/349; 325/455; 329/106; 329/111
[58] Field of Search ............... 325/363, 364, 344, 349, 325/347, 397, 398, 472, 455, 459, 464, 469; 329/106, 111

[56] References Cited

U.S. PATENT DOCUMENTS

| 3,366,894 | 1/1968 | Newcomb | 329/106 |
| 3,471,392 | 10/1969 | Axford | 325/349 |
| 3,878,430 | 1/1975 | Boltz, Jr. | 329/106 |
| 3,886,463 | 5/1975 | Caprio | 329/106 |

Primary Examiner—Robert L. Griffin
Assistant Examiner—Tommy P. Chin
Attorney, Agent, or Firm—Gerald J. Ferguson, Jr.; Joseph J. Baker

[57] ABSTRACT

A tuning meter circuit for use with a pulse count FM demodulator of an FM receiver. The circuitry comprises a limiter circuit for amplitude limiting a frequency modulated input signal to produce a train of pulses the width of which varies in accordance with the frequency modulation of the input signal; a pulse shaping circuit for generating a trigger pulse for each of the pulses of the pulse train; a monostable multivibrator responsive to each trigger pulse for generating a train of pulses of substantially constant width, the number of which per unit time interval varies in accordance with the frequency modulation of the input signal; a low pass filter responsive to the last mentioned pulse train to produce a low frequency signal and thereby demodulate the frequency modulated signal; a difference amplifier also responsive to the last-mentioned pulse train, the difference amplifier having a threshold level at which it changes state; a tuning meter responsive to the direct current component of the output of the difference amplifier; the duty cycle of the monostable multivibrator and the threshold level of the difference amplifier being so related that the tuning indicator indicates the FM receiver is tuned correctly when a signal of exact intermediate frequency is applied to the limiter circuit; and where the monostable multivibrator includes means for varying the duty cycle thereof to compensate for undesired variations in the FM demodulator.

6 Claims, 2 Drawing Figures

TUNING METER FOR USE WITH A PULSE COUNT FM DEMODULATION CIRCUIT

BACKGROUND OF THE INVENTION

This invention relates to a tuning meter in a pulse count type FM demodulation circuit and circuitry for easily effecting adjustment of the indication of the tuning meter.

Other objects and advantages of this invention will be apparent from a reading of the following specification and claims taken with the drawing.

BRIEF DESCRIPTION OF THE DRAWING

FIG. 1 is a schematic diagram of an illustrative embodiment of this invention while

DETAILED DESCRIPTION OF THE PREFERRED EMBODIMENT

Figure 1:
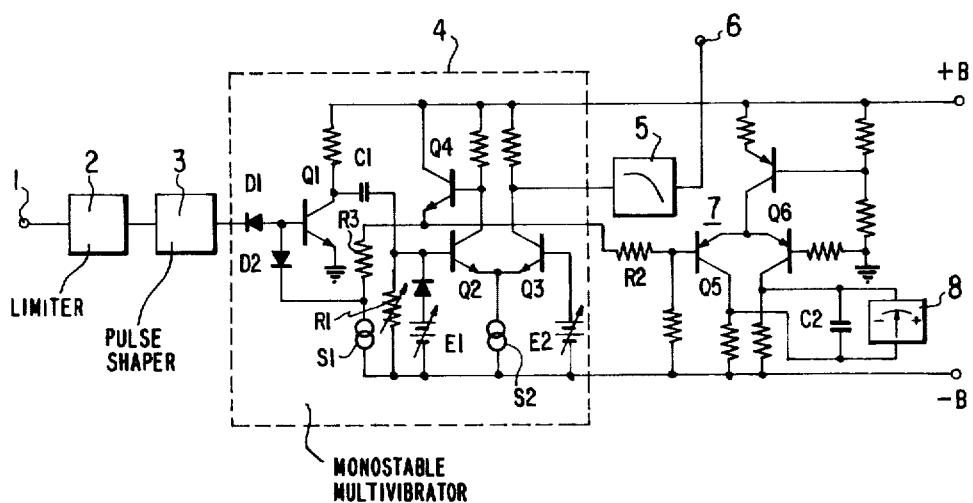

FIG. 1 is a schematic diagram of an illustrative embodiment of this invention. In the Figure, 1 is an input terminal, 2 is a limiter circuit, 3 is a pulse shaping circuit, 4 is a monostable multivibrator, 5 is a low pass filter, 6 is an output terminal, 7 is a differential amplifier, 8 is a tuning meter. A monostable multivibrator 4 comprises a transistor $Q_1$, a gate circuit comprising diodes $D_1$ and $D_2$, a time constant circuit comprising condenser $C_1$ and resistor $R_1$ and an inverter circuit comprising a differential amplifier employing a pair of transistors $Q_2$, $Q_3$ and constant current source $S_2$. The collector output of transistor $Q_2$ is returned to transistor $Q_1$ via an emitter follower transistor $Q_4$ and $R_3$, the junction of $D_2$ and $R_3$ being connected to constant current source $S_1$, and is applied to the base of transistor $Q_5$ of differential amplifier 7 via a resistor $R_2$.

Figure 2:
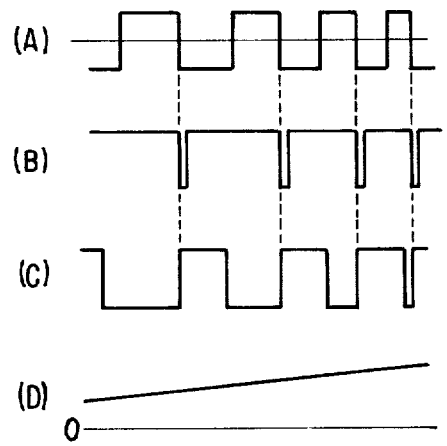
FIGS. 2(A)–2(D) show pulse wave shapes illustrating the operation of FIG. 1.

In operation, when an FM input signal is applied to input terminal 1, it is converted into the amplitude limited pulse signal shown in FIG. 2(A) by limiter circuit 2. A trigger pulse as shown in FIG. 2(B) is then shaped by pulse shaping circuit 3, a suitable circuit for this purpose being described in a co-pending application U.S. Ser. No. 859,539 filed on Dec. 12, 1977 by Yukihiko Miyamoto and Tsuneo Yamada entitled "Improved Pulse Shaping Circuit", which is incorporated herein by reference although a simple differentiating circuit as shown in FIG. 1 of the foregoing application may also be used in some instances. When the trigger pulse from pulse shaping circuit 3 triggers monostable multivibrator 4, the output is a pulse signal as shown in FIG. 2(C). The output pulse signal of monostable multivibrator 4 is applied to low-pass filter 5. The output is a demodulated low frequency signal as shown in FIG. 2(D).

The opposite phase of the above output pulse signal from monostable multivibrator 4 is applied to transistor $Q_5$ of differential amplifier 7 via emitter follower transistor $Q_4$ and resistor $R_2$. The monostable multivibrator 4 generates an output pulse with a duty ratio of 50% when a signal of exact intermediate frequency is applied to input terminal 1. Moreover, the threshold level of differential amplifier 7 is set by transistor $Q_6$ at one-half the amplitude of the output pulse of monostable multivibrator 4. Accordingly, indication of the zero point of tuning meter 8 ought to be the point of complete alignment. A condenser $C_2$ for alternating current by-pass is in parallel with tuning meter 8 and the tuning meter is responsive to only the direct current output of differential amplifier 7.

However, when a signal of exact intermediate frequency is imposed, indication of tuning meter 8 may deviate from the zero point to the positive potential side or the negative potential side due to the influence of variations in resistors, condensers, transistors, line voltage, etc. Thus, when the meter indication deviates to the positive potential side, the width of the output pulse of monostable multivibrator 4 can be narrowed and in the case of deviation to the negative potential side, it can be expanded. The foregoing variations in the output pulse width can be effected by altering the resistance of resistor $R_1$ in the time constant circuit of the monostable multivibrator 4, by altering the voltage of the base bias power source $E_1$ of transistor $Q_2$ in the differential amplifier or by altering the threshold level by changing the voltage of the base bias power source $E_2$ of transistor $Q_3$. As a result, the error in indication of tuning meter 8 can be eliminated to achieve an accurate zero point.

As indicated above, adjustment in accordance with this invention of tuning meter indication can be easily effected by changing the width of the output pulse of monostable multivibrator 4.

What is claimed is:

1. A tuning meter circuit for use with an FM demodulator comprising
    means including a monostable multivibrator responsive to a frequency modulated input signal for generating at the output of said monostable multivibrator a train of pulses of substantially constant width, the number of which per unit time interval varies in accordance with the frequency modulation of said input signal;
    a difference amplifier responsive to said pulse train, said difference amplifier having a threshold level at which it changes state; and
    a tuning meter responsive to said difference amplifier the duty cycle of said monostable multivibrator and the threshold level of said difference amplifier being so related that said tuning indicator indicates said FM receiver is tuned when a signal of exact intermediate frequency is applied to said FM demodulator.

2. A tuning meter circuit as in claim 1 where said monostable multivibrator includes means for varying said duty cycle thereof to compensate for undesired variations in said FM demodulator.

3. A tuning meter circuit as in claim 1 where said duty cycle of the monostable multivibrator is 50%.

4. A tuning meter circuit for use with a pulse count FM demodulator of an FM receiver comprising
    a limiter circuit for amplitude limiting a frequency modulated input signal to produce a train of pulses the width of which varies in accordance with the frequency modulation of said input signal;
    a pulse shaping circuit for generating a trigger pulse for each of the pulses of said pulse train;
    a monostable multivibrator responsive to each trigger pulse for generating a train of pulses of substantially constant width, the number of which per unit time interval varies in accordance with the frequency modulation of said input signal;
    a low pass filter responsive to said last mentioned pulse train to produce a low frequency signal and thereby demodulate said frequency modulated signal;

a difference amplifier also responsive to said last mentioned pulse train, said difference amplifier having a threshold level at which it changes state;

a tuning meter responsive to the direct current component of the output of said difference amplifier; and the duty cycle of said monostable multivibrator and the threshold level of said difference amplifier being so related that said tuning indicator indicates said FM receiver is tuned when a signal of exact intermediate frequency is applied to said limiter circuit.

5. A tuning meter circuit as in claim 4 where said monostable multivibrator includes means for varying said duty cycle thereof to compensate for undesired variations in said FM demodulator.

6. A tuning meter circuit as in claim 4 where said duty cycle of the monostable multivibrator is 50%.

* * * * *